United States Patent
Uchiyama et al.

(10) Patent No.: US 6,681,468 B1
(45) Date of Patent: Jan. 27, 2004

(54) DEVICE AND METHOD FOR MOUNTING PARTS

(75) Inventors: Hiroshi Uchiyama, Kofu (JP);
Hirofumi Obara, Yamanashi (JP);
Naoto Mimura, Yamanashi (JP);
Osamu Okuda, Yamanashi (JP); Akira Kabeshita, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 1 day.

(21) Appl. No.: 10/129,190

(22) PCT Filed: Oct. 27, 2000

(86) PCT No.: PCT/JP00/07522
§ 371 (c)(1),
(2), (4) Date: May 2, 2002

(87) PCT Pub. No.: WO01/35706
PCT Pub. Date: May 17, 2001

(30) Foreign Application Priority Data

Nov. 5, 1999 (JP) ............................................. 11-315159

(51) Int. Cl.⁷ ............................................... B23Q 17/00
(52) U.S. Cl. ...................... 29/407.01; 29/407.1; 29/740
(58) Field of Search .................... 29/407.01, 407.04, 29/407.05, 407.09, 407.1, 740, 759, 833, 834

(56) References Cited

U.S. PATENT DOCUMENTS

| | | | | |
|---|---|---|---|---|
| 4,342,090 A | * | 7/1982 | Caccoma et al. ............... | 716/8 |
| 4,442,388 A | * | 4/1984 | Phillips ....................... | 318/640 |
| 4,670,981 A | * | 6/1987 | Kubota et al. ................. | 29/840 |
| 5,233,745 A | * | 8/1993 | Morita ......................... | 29/705 |
| 5,336,935 A | * | 8/1994 | Shitanda et al. ............ | 307/116 |
| 5,539,977 A | * | 7/1996 | Kano et al. .................... | 29/833 |
| 5,864,944 A | * | 2/1999 | Kashiwagi et al. ........... | 29/833 |
| 5,911,456 A | * | 6/1999 | Tsubouchi et al. ............ | 29/833 |
| 5,953,812 A | * | 9/1999 | Ferrante ...................... | 29/714 |
| 6,195,878 B1 | * | 3/2001 | Hata et al. ................... | 29/832 |
| 6,230,393 B1 | * | 5/2001 | Hirano et al. ................ | 29/740 |
| 6,389,683 B1 | * | 5/2002 | Mori et al. ................... | 29/740 |
| 6,493,931 B2 | * | 12/2002 | Hirano et al. ............... | 29/832 |

FOREIGN PATENT DOCUMENTS

| | | | | |
|---|---|---|---|---|
| JP | 3-289197 | | 12/1991 | |
| JP | 4-69118 | | 3/1992 | |
| JP | 406314897 A | * | 11/1994 | .................. 29/712 |
| JP | 2000-133989 | | 5/2000 | |

* cited by examiner

Primary Examiner—Gregory Vidovich
Assistant Examiner—Essama Omgba
(74) Attorney, Agent, or Firm—Wenderoth, Lind & Ponack, L.L.P.

(57) ABSTRACT

A component mounting apparatus and method allows for components supplied from component supplying members to be simultaneously or continuously held by component holding members without being affected by positional displacements of the component holding members relative to a head, a positional displacement of the component supplying members or the like. With a positional displacement amount ($\Delta y$) along a Y direction relative to a reference position of a nozzle taken into account, at a component supply cassette, driving a motor for moving components one by one along the Y direction to a component supply position is controlled, thereby positionally adjusting a component at the component supply position and absorbing the positional displacement amount.

8 Claims, 9 Drawing Sheets

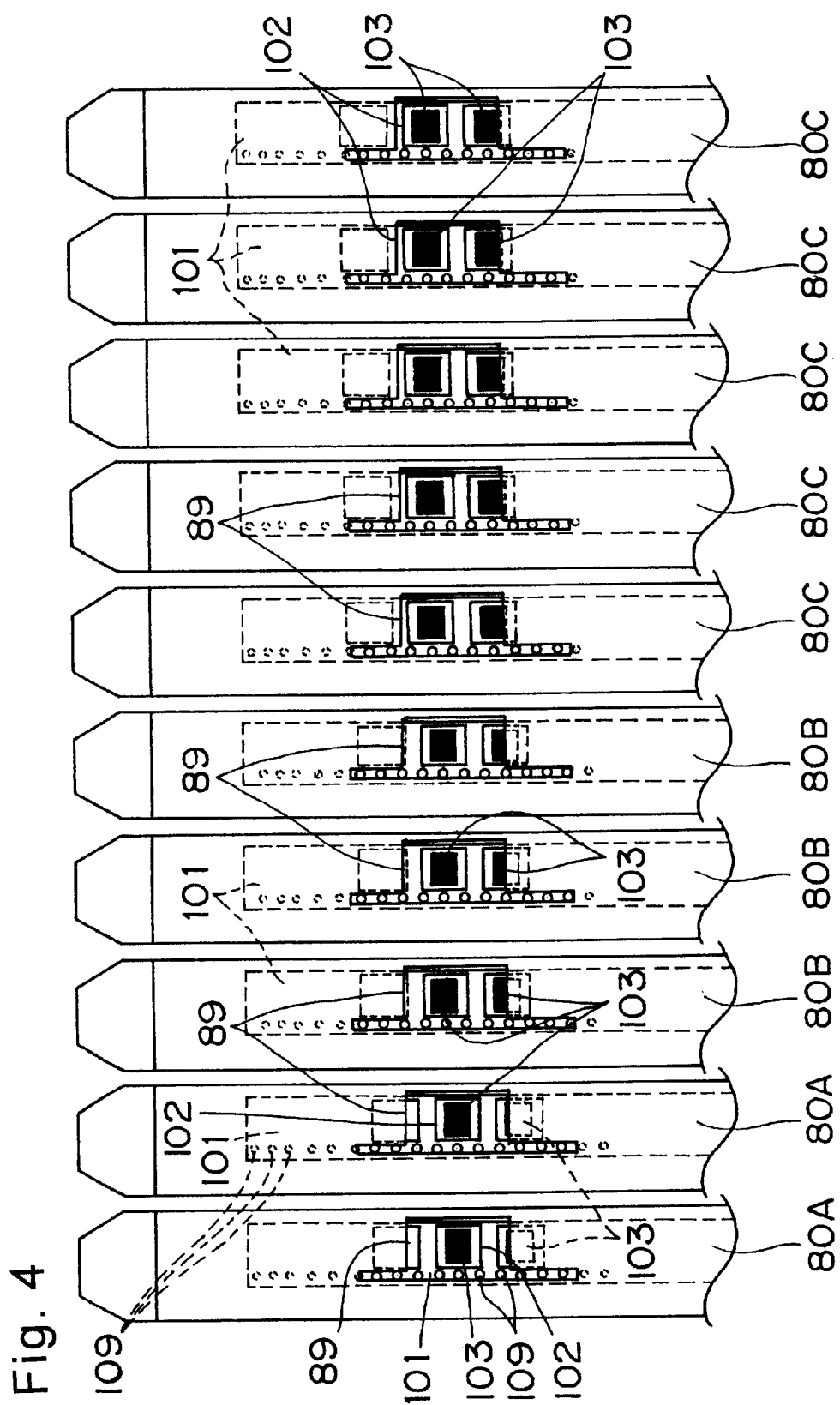

REFERENCE POSITION

DEVICE AND METHOD FOR MOUNTING PARTS

TECHNICAL FIELD

The present invention relates to an apparatus and a method for mounting components, whereby a plurality of components a replaced onto a mounting base object (a body to be mounted) such as a board or the like after a component supplied to a component supply position of a component supplying member, for supplying components one by one to the component supply position, is held by a component holding member.

BACKGROUND ART

Component mounting apparatuses of various structures have been developed to respond to a need for high-speed mounting in recent years. For example, one of apparatuses proposed has a plurality of component supply cassettes for storing a plurality of components in component supply tapes and supplying respective components to component supply positions, so that components supplied to the component supply positions are sucked and held simultaneously by a plurality of suction nozzles and then placed onto a board.

Meanwhile, a deflection resulting from a machining accuracy is inherent in a shaft of a nozzle as shown in FIG. 11. Even when each nozzle is positionally adjusted to an original position relative to a reference position along a reference center axis of a respective nozzle shaft (one-dotted chain line in the drawing), the nozzle has increased positional displacement, at a nozzle leading end, from the reference center axis of the shaft between the original position and a placing position lowered from the original position when the shaft is moved up and down by an actuator. In order for detecting such positional displacement and thereby improving a component placing accuracy, a plurality of suction nozzles fitted to one head is recognized by a recognition camera in a state not sucking components and an amount of positional displacement of each of the plurality of suction nozzles is detected between an original position and a placing position moved down from the original position. Each suction nozzle is rotated about its axis on the basis of a detected amount of respective positional displacement to eliminate positional displacement. The plurality of suction nozzles can accordingly simultaneously suck and hold a plurality of components supplied to respective component supply positions by a plurality of component supply cassettes.

In the above structure, in the event that the detected positional displacement amount is too large to eliminate through rotation of a suction nozzle about its axis, the suction nozzle with the large amount of the positional displacement has a large positional displacement amount from a component supply position of a component supply cassette and thus cannot suck and hold a component even when the plurality of components supplied from the plurality of component cassettes are to be sucked and held simultaneously by the plurality of component suction nozzles. Moreover, if a component cannot be correctly sent to a component supply position of a component supply cassette because of a positional displacement of a carrier tape holding the component, which results from an attaching error of the carrier tape relative to the component supply cassette, the component cannot be sucked by a suction nozzle.

The present invention has for its object to provide an apparatus and a method for mounting components whereby components supplied from component supplying members can be simultaneously or continuously held by component holding members without being affected by a positional displacement of the component holding members relative to a head or a positional displacement of the component supplying members, and the like, with an aim to solve the above-described issues.

SUMMARY OF THE INVENTION

In order to accomplish the above object, the present invention is constituted as described hereinbelow.

According to a first aspect of the present invention, there is provided a component mounting apparatus in which each of plural components supplied to a component supply position of a component supplying member, for supplying the components, is held by a component holding member and then placed onto a mounting base object.

The component holding member is set to a head which is movable in mutually orthogonal first and second directions.

The component supplying member comprises a component supply driving device for moving the components one by one along the second direction to the component supply position, thereby moving the components one by one along the second direction to the component supply position by operating the component supply driving device.

The component mounting apparatus comprises a positional displacement detecting device for detecting a positional displacement, along the second direction, of the component holding member or the component held by the component holding member relative to a reference position of the component holding member.

Accordingly, a movement amount for moving the components one by one along the second direction to the component supply position is adjusted through driving control provided to the component supply driving device at the component supplying member, where a component is to be held by the component holding member, based on an amount of positional displacement along the second direction of the component holding member or the component held by the component holding member relative to the reference position of the component holding member. This amount is determined on basis of a detection result of the positional displacement detecting device, with a positional displacement amount being taken into account, so that a component supplied to the component supply position, with the movement amount adjusted at the component supplying member, is held by the component holding member displaced by the positional displacement amount.

According to a second aspect of the present invention, there is provided a component mounting apparatus in which components supplied to corresponding respective component supply positions of component supplying members, for respectively supplying the components, are respectively held by component holding members and then placed onto a mounting base object.

The component holding members are set to one head which is movable in mutually orthogonal first and second directions.

Each of the component supplying members comprises a component supply driving device for moving the components one by one along the second direction to the component supply positions, thereby moving the components one by one along the second direction to the component supply positions by operating the component supply driving device.

The component mounting apparatus comprises a positional displacement detecting device for detecting a positional displacement, along the second direction, of each of the component holding members or each component held by a respective component holding member relative to a reference position of each of the component holding members.

Accordingly, a movement amount for moving the components one by one along the second direction to the component supply positions is adjusted through driving control provided to each of the component supply driving devices at each of the component supplying members, where a component is to be held by a respective component holding member, based on an amount of positional displacement along the second direction of each of the component holding members or each component held by a respective component holding member relative to the reference position of each of the component holding members. This amount is determined on the basis of a detection result of the positional displacement detecting device, with a positional displacement amount being taken into account, so that respective components supplied to respective component supply positions, with movement amounts adjusted at respective component supplying members, are held by respective component holding members displaced by the respective positional displacement amounts.

According to a third aspect of the present invention, there is provided a component mounting apparatus according to the second aspect, wherein the positional displacement detecting device can detect a positional displacement along the first direction of each of the component holding members or each component held by a respective component holding member relative to respective reference positions of respective component holding members.

Accordingly, an average value of amounts of positional displacement along the first direction of the component holding members or components held by the respective component holding members relative to respective reference positions of the respective component holding members, which are determined on the basis of a detection result of the positional displacement detecting device, is obtained. Based on the average valve a reference position of the head is adjusted before components supplied to the component supply positions from the component supplying members are held by the component holding members.

According to a fourth aspect of the present invention, there is provided a component mounting apparatus according to the first aspect, in which, before holding components, whether or not a positional displacement amount is within a range correctable by driving control of the component supply driving device is judged, and adjusted is a movement amount for moving the components one by one along the second direction to the component supply position through the driving control of the component supply driving device when the positional displacement amount is in such a range, or moved is the component holding member by the positional displacement amount along the second direction without executing driving control of the component supply driving device when the positional displacement amount is outside the range.

According to a fifth aspect of the present invention, there is provided a component mounting apparatus according to either second or third aspect, in which whether or not each of positional displacement amounts is in a range correctable by driving control of each of the component supply driving devices is judged, and adjusted is a movement amount for moving each component one by one along the second direction to a respective component supply position through driving control of each of the component supply driving devices when all of the positional displacement amounts are within such a range, or the component holding members other than the component holding members having the positional displacement amount outside the range are allowed to hold components when any of the positional displacement amounts is outside the range, and the component holding members are moved by an amount corresponding to the positional displacement amount outside the range along the second direction, and then, the component holding members having the positional displacement amount outside the range are allowed to hold a component.

According to a sixth aspect of the present invention, there is provided a component mounting method for placing each of plural components, supplied to a component supply position of a component supplying member for supplying the components, onto a mounting base object after holding the components by a component holding member set to a head movable in mutually orthogonal first and second directions. The method comprises:

detecting a positional displacement along the second direction of the component holding member or a component held by the component holding member relative to a reference position of the component holding member; and adjusting a movement amount for moving the components one by one along the second direction to the component supply position through driving control of a component supply driving device for moving the components one by one along the second direction to the component supply position at the component supplying member, where the component is to be held by the component holding member based on an amount of the positional displacement along the second direction of the component holding member or the component held by the component holding member relative to the reference position of the component holding member, which amount is determined on the basis of a detection result at a time of detecting the positional displacement, with the positional displacement amount being taken into account, and then holding the component supplied to the component supply position via the adjusted movement amount at the component supplying member with the component holding member displaced by the positional displacement amount.

According to a seventh aspect of the present invention, there is provided a component mounting method for respectively placing a components, supplied to respective component supply positions from component supplying members for respectively supplying the components, onto a mounting base object after respectively holding the components by component holding members set to a head movable in mutually orthogonal first and second directions. The method comprises:

detecting a positional displacement along the second direction of each of the component holding members or each component held by a respective component holding member relative to a reference position of each of the component holding members; and adjusting each movement amount for moving the components one by one along the second direction to a respective component supply position through driving control of a component supply driving device for moving the components one by one along the second direction to the respective component supply position at each component supplying member, where the component is to be held by each of the component holding members, based on an amount of each positional displacement along the second direction of the component holding members or each component held by a respective component holding member relative to the reference position of each of the component holding members, which amount is determined on the basis of detection result at a time of detecting positional displacement, with each positional displacement amount being taken into account, and then holding each component supplied to a respective component supply position via the adjusted movement amount with a respective component holding member displaced by the positional displacement amount.

According to an eighth aspect of the present invention, there is provided a component mounting method according to the seventh aspect, further comprising: detecting a positional displacement along the first direction of each of the component holding members or each component held by a respective component holding member relative to the reference position of the respective component holding, member at a detection time; and obtaining an average value of amounts of positional displacement along the first direction of the component holding members or the components held by the component holding members relative to the reference positions of the component holding members, which amounts are determined on the basis of the detection result at the time of detecting the positional displacement; then, adjusting a reference position of the head based on the obtained average value; and thereafter holding the components supplied to the component supply positions, from the component supplying members, by the component holding members.

According to a ninth aspect of the present invention, there is provided a component mounting method according to the sixth aspect, further comprising judging whether or not the positional displacement amount is within a range correctable by driving control of the component supply driving device, and adjusting a movement amount for moving the components one by one along the second direction to the component supply position through driving control of the component supply driving device when the positional displacement amount is in the range, or moving the component holding member by the positional displacement amount along the second direction without executing driving control of the component supply driving device when the positional displacement amount is outside the range, and thereafter holding a component with the component holding member.

According to a tenth aspect of the present invention, there is provided a component mounting method according to either the seventh or eighth aspect, further comprising: judging whether or not each of the positional displacement amounts is in a range correctable by driving control of each of the component supply driving devices; and (i) adjusting each movement amount for moving the components one by one along the second direction to a respective component supply position through driving control of each of the component supply driving devices when all of the, positional displacement amounts are within the range, or (ii) causing component holding members, other than component holding members having the positional displacement amount outside the range, to hold components when any of the positional displacement amounts is outside the range, then moving the head by an amount corresponding to the positional displacement amount outside the range along the second direction, and thereafter causing the component holding members having the positional displacement amount outside the range to hold components.

BRIEF DESCRIPTION OF DRAWINGS

These and other aspects and features of the present invention will become clear from the following description taken in conjunction with preferred embodiments thereof with reference to the accompanying drawings, in which:

FIG. 4 is a partial enlarged plan view explanatory of an adjustment state of a tape feed amount at the component supply cassettes of the component mounting apparatus;

DETAILED DESCRIPTION OF THE PREFERRED EMBODIMENTS

Figure 1:
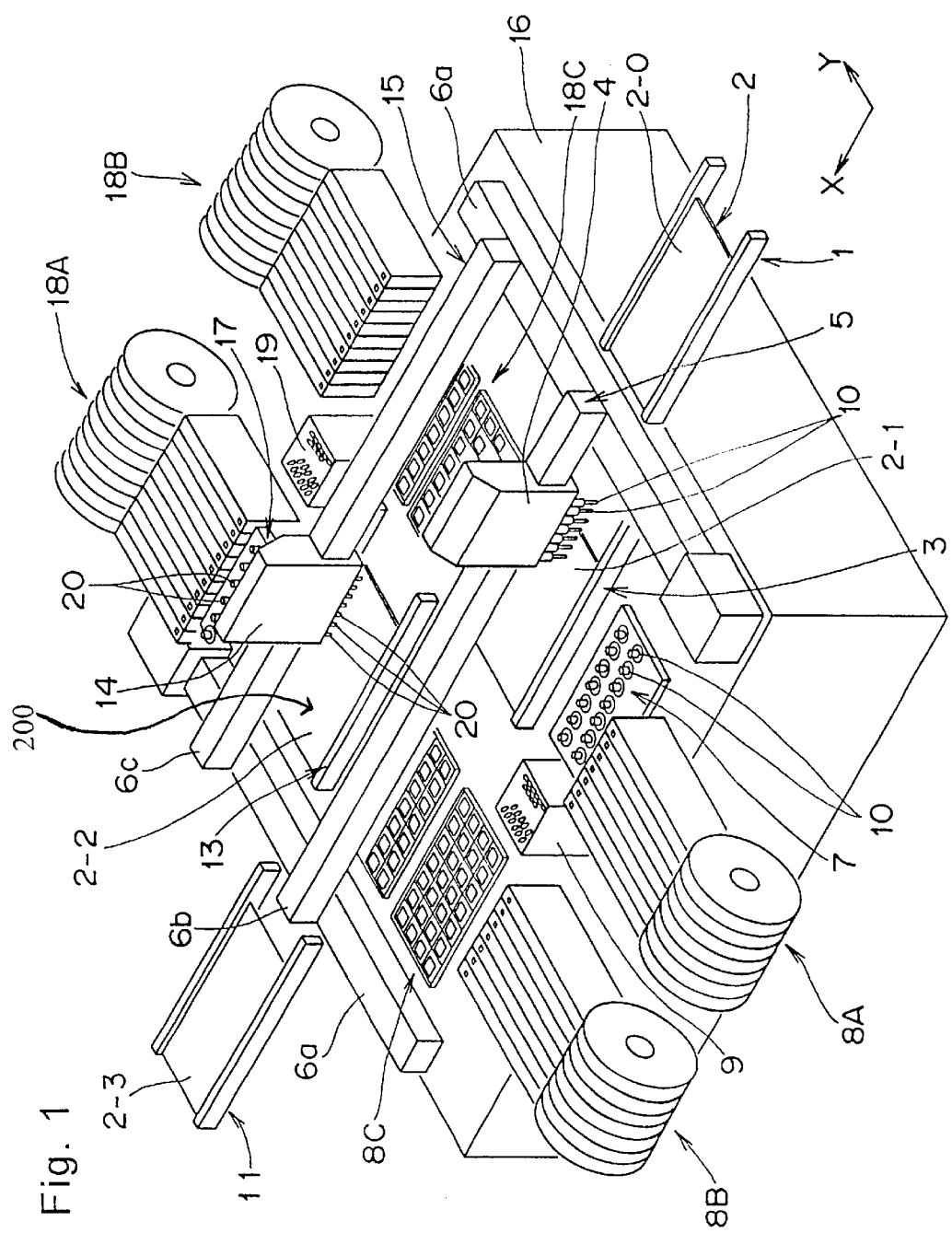
FIG. 1 is a perspective view of a component mounting apparatus according to one embodiment of the present invention.

Before description of the present invention proceeds, it is to be noted that like parts are designated by like reference numerals throughout the accompanying drawings.

Embodiments of the present invention will be described below in detail on the basis of drawings.

A schematically perspective view of an entire component mounting apparatus according to one embodiment of the present invention is shown in FIG. 1.

In FIG. 1, reference numeral 1 is a loader for carrying in a circuit board 2-0 (designated by a reference numeral 2 to show the board irrespective of a position, and designated by reference numerals 2-0, 2-1, 2-2 and 2-3 to show the board at specific positions), and reference numeral 11 is an unloader for carrying out the circuit board 2-3. Reference numeral 3 is a first board transferring holding device with a pair of support rail parts for transferring and holding the circuit board 2 carried in from the loader 1. Reference numeral 4 is a working head having a plurality of, e.g., ten component suction nozzles 10 fitted replaceably for sucking and holding components. Each of the component suction nozzles is an example of a component holding member. Reference numeral 5 is an XY robot for positioning the working head 4 to a predetermined position in two XY directions orthogonal to each other within a component mounting working area. Reference numeral 7 is a nozzle station arranged in the vicinity of a component supply part 8A of the component mounting working area, where nozzles. 10 of a plurality of kinds, stored conforming to components of a plurality of kinds, are replaced with nozzles 10 fitted to the working head 4 upon necessities. Reference numerals 8A, 8B are component supply parts arranged in front of the component mounting working area relative to workers, that is, at a forward end part, and having a plurality of component supply cassettes 80 for storing components 103, to be mounted onto the board 2 one by one, in component storage recesses 102 of a carrier tape 101 and supplying the components 103 one by one to component supply positions 89. Reference numeral 8C is a component supply part disposed in the vicinity of the component supply part 8B for storing and holding tray components, to be mounted onto the board 2, in a tray. Reference numeral 9 is a recognition camera set to a side close to a center of the component mounting working area, near the component supply part 8A, for picking up images of suction postures of components sucked by the nozzles 10 of the working head 4.

On the other hand, reference numeral 13 is a second board transferring holding device with a pair of support rail parts for transferring and holding the circuit board 2-1 sent from the first board transferring holding device 3. Reference numeral 14 is a working head having a plurality of, for instance, ten component suction nozzles 20, as an example of a component holding member, replaceably set for sucking and holding components. Reference numeral 15 is an XY robot for positioning the working head 14 to a predetermined position in two orthogonal XY directions in a component mounting working area. Reference numeral 17 is a nozzle station disposed in the vicinity of a component supply part 18A where nozzles 20 of a plurality of kinds, fit to components of a plurality of kinds, are stored and replaced with nozzles 20 set to the working head 14 if necessary. Reference numerals 18A, 18B are component supply parts set in back of the component mounting working area relative to workers, i.e., at a rear end part of the apparatus, having a plurality of component supply cassettes 80 in which are stored components 103, to be mounted to the board 2-1 one by one, in component storage recesses 102 of a carrier tape 101 for supplying the components 103 one by one to the component supply positions 89. Reference numeral 18C is a component supply part disposed in the vicinity of the component supply part 18B for storing and holding tray components, to be mounted to the board 2, in a tray. Reference numeral 19 is a recognition camera arranged at a side close to a center of the component mounting working area, in the vicinity of the component supply part 18A, for picking up images of suction postures of components sucked by the nozzles of the working head 14.

The above XY robots 5, 15 are constructed as described below. Two Y-axis driving parts 6a, 6a are fixedly arranged to a front and a rear edge of a component mounting working area 200 on a mounting apparatus base 16. Two X-axis driving parts 6b, 6c intersecting the two Y-axis driving parts 6a, 6a are arranged independently movable in a Y-axis direction so as to be able to avoid collision. Moreover, the working head 4 which can move within a mounting area of a front half of the component mounting working area 200 is set to the X-axis driving part 6b to be movable in an X-axis direction, and the working head 14 which can move in a mounting area of a rear half of the component mounting working area 200 is set to the X-axis driving part 6c to be movable in an X-axis direction. The XY robot 5 is thus constituted of the two Y-axis driving parts 6a, 6a fixed to the mounting apparatus base 16, the X-axis driving part 6b connected to the Y-axis driving parts 6a, 6a so as to be movable in a Y-axis direction, and the working head 4 connected to the X-axis driving part 6b so as to be movable in an X-axis direction. The XY robot 15 is constituted of the two Y-axis driving parts 6a, 6a fixed to the mounting apparatus base 16, the X-axis driving part 6c connected to the Y-axis driving parts 6a, 6a so as to be movable in a Y-axis direction, and the working head 14 connected to the X-axis driving part 6c so as to be movable in an X-axis direction. The working heads 4, 14 can accordingly move in the XY directions independently of each other.

Figure 5:
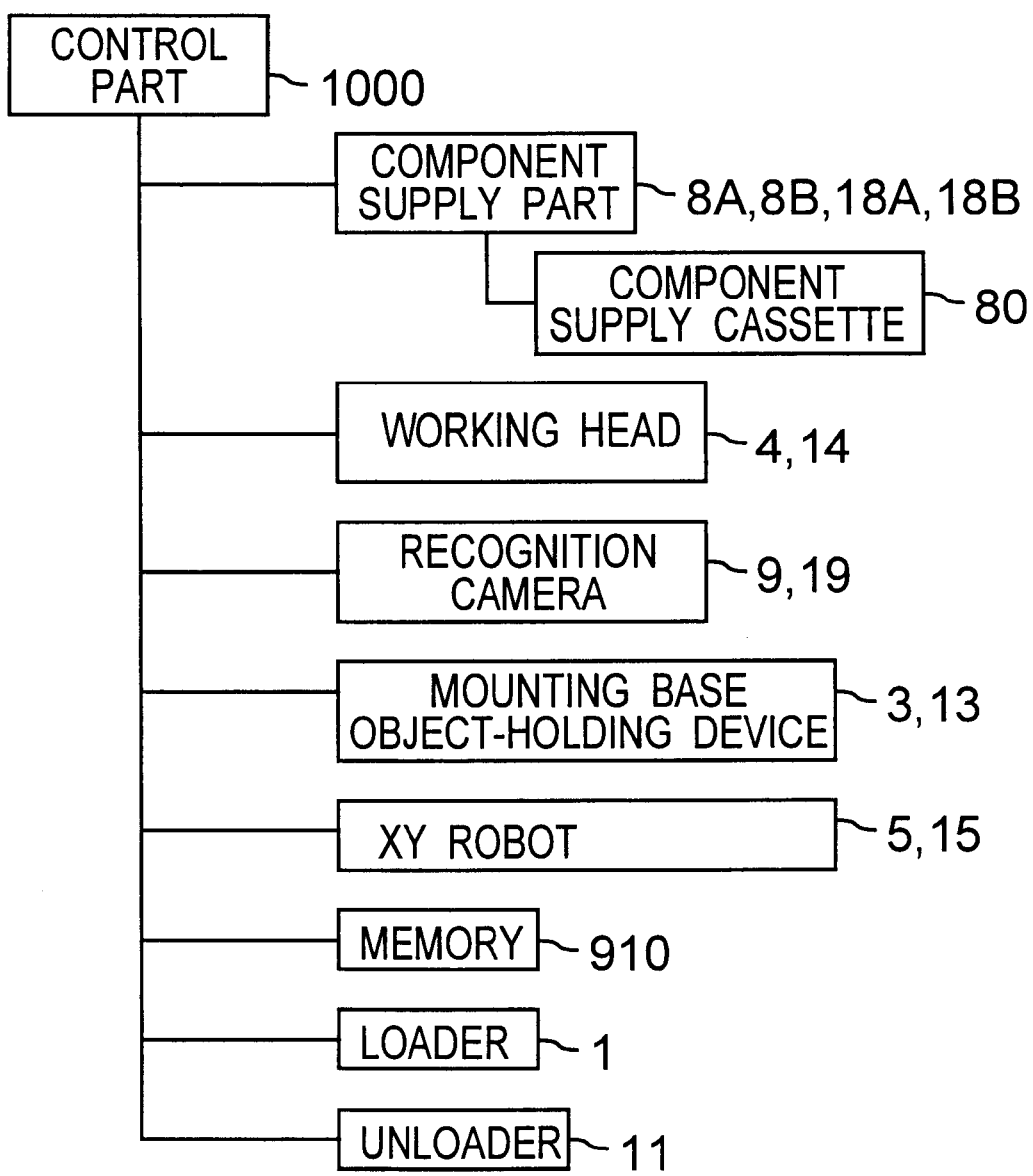
FIG. 5 is a block diagram indicative of a relationship of a control part of the component mounting apparatus and other devices or members.
Figure 6:
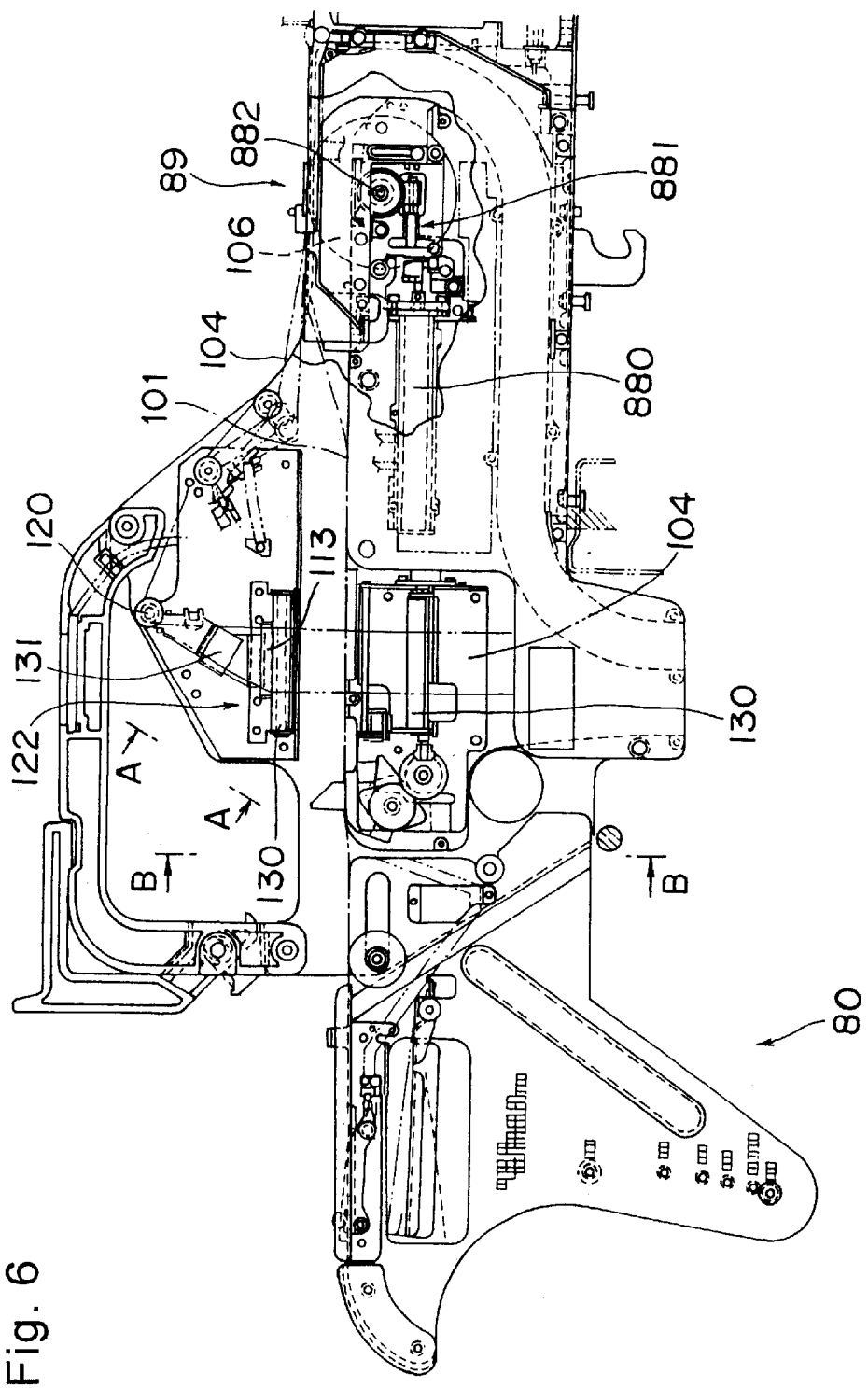
FIG. 6 is a partial side view of a component supply cassette of the component mounting apparatus.

As shown in FIGS. 4 and 6, a sprocket 106 set to a leading end of each component supply cassette 80 of the component supply parts 8A, 8B, 18A, 18B is engaged with feed holes 109 formed continuously at an equal distance relative to a side end part of the carrier tape 101. The sprocket 106 has a driving gear 882 fixed thereto. The driving gear 882 is coupled via a gear transmission mechanism 881 to a component supply driving device, for example, a pulse motor 880. When the sprocket 106 is rotated by a predetermined amount by the pulse motor 880 via the gear transmission mechanism 881 and the driving gear 882, the carrier tape 101 is sent by a predetermined pitch, whereby components 103 stored and held individually in the component storage recesses 102 of the carrier tape 101 are positioned one by one at the component supply position 89 formed as a component supply opening of the cassette 80 and, supplied for holding. A sent amount of the carrier tape 101 can be changed by adjustment of a rotation amount of the pulse motor 880 through driving control of the pulse motor 880 by a control part 1000 (referring to FIG. 5). Each component storage recess 102, namely, component 103 can be changed in the Y position at the component supply position 89 in this manner.

The control part 1000 is provided for controlling the above operations of carrying in and carrying out boards, holding components, recognizing components, placing components, and the like, and is connected to the component supply parts 8A, 8B, 18A, 18B, the component supply cassettes 80, the working heads 4, 14, recognition cameras 9, 19, devices 3, 13 for holding mounting base objects (bodies to be mounted), XY robots 5, 15, a memory 910, the loader 1, the unloader 11, etc. The memory 910 stores: NC data indicating a mounting program by which components are to be placed at certain positions in a specific order or the like; an arrangement program by which components are to be arranged at certain component supplying members, or arrangement information by which components have been arranged; a component library of component information related to a shape, a height, and the like of each component, board information related to a shape of each board, and other information such as information pertaining to a shape of the component suction nozzles, a board transfer position of each support rail part, and the like.

The above recognition cameras 9, 19 not only pick up images of suction postures of components sucked by the nozzles 10 and 20 as described above, but also function as positional displacement detecting devices for detecting positional displacement of a corresponding suction nozzle 10 or 20 relative to a reference position thereof. More specifically, a nozzle shaft generates an initial positional displacement between an original position of a nozzle 10, 20 and a placing position lowered from the original position because of a machining accuracy, or the like reason, when each nozzle moves up and down. In order to correct (calibrate) the initial positional displacement of each suction nozzle 10, 20, which is generated at the nozzle shaft in this manner, each suction nozzle moved down to a position corresponding to a placing position in a state while sucking and holding a calibration jig similar to a component to be sucked, or in a state without sucking and holding anything, is rotated by angle θ about its axis, and initial positional displacements in each of X and Y directions relative to a reference position, i.e., a reference center axis of the nozzle shaft (one-dotted chain line in the drawings) are detected.

A detection result recognized, that is, detected by the recognition cameras 9, 19 in this manner is input to the control part 1000. The control part 1000 operates to move nozzle 10, 20 an initial positional displacement amount Δx in the X direction, and an initial positional displacement amount Δy in the Y direction, at a time when the nozzle 10, 20 is rotated by 0 with respect to the reference position on the basis of information of the detection result by using a position where the nozzle 10, 20 is to be normally positioned, i.e., the reference center axis of the nozzle shaft as the reference position, and thus obtains the initial positional displacement amount Δx in the X direction and the initial positional displacement amount Δy in the Y direction. The obtained initial positional displacement amount Δx in the X direction and the initial positional displacement amount Δy in the Y direction are stored in the memory 910. The control part 1000 specifies, with reference to a mounting program stored in the memory 910, each component supply cassette 80 to which each suction nozzle 10,20 executes a subsequent component suction operation. The control part 1000 sends the initial positional displacement amount Δy in the Y direction with respect to the reference position of the suction nozzle 10,20 as initial correction information (correction information for the nozzle) to a pulse motor driving control part (not shown) for adjusting a rotation amount of the pulse motor 880 of a specified component supply cassette 80. Based on the initial correction information, a rotation amount of each pulse motor 880 is adjusted. By an arrangement whereby the rotation amount of each pulse motor 880 is adjusted on the basis of respective initial correction information, with the initial positional displacement amount of each suction nozzle 10,20 being taken into account at each component supply cassette 80 from which a subsequent component is to be sucked by the suction nozzle 10,20, a movement amount for moving each component 103 to component supply position 89 along the Y direction is adjusted, and position of the component at the component supply position 89 is adjusted. Accordingly, each component 103 is positioned to a position in response to initial positional displacement of nozzle 10,20 which next sucks a component, thereby absorbing the initial positional displacement amount of the nozzle 10,20. A component 103 at component supply position 89 can hence be surely sucked and held by nozzle 10,20. Since the above initial correction information is specific information for each nozzle 10,20, the information is sent to a component supply cassette 80 corresponding to the nozzle 10,20 before the nozzle performs a subsequent component suction operation, with which a rotation amount of a corresponding pulse motor 880 is adjusted. This operation of detecting initial positional displacement, and operating the initial correction information can be executed, for instance, for each nozzle 10,20 at a start of production, for each nozzle 10,20 every time a predetermined amount of bodies to be mounted, such as boards or the like, are produced, or every time a production type of bodies to be mounted is changed.

An operation of mounting can be carried out in a manner to be described below, in a state where initial positional displacement is corrected as above.

Suction nozzles 10, . . . , 20 fitted to each of the working heads 4, 14 of the XY robots 5, 15 movable in the XY directions of the component mounting apparatus operate as follows. Here, the nozzles 10, . . . , 20 of the two working heads 4, 14 operate in an equal fashion in an equal structure and therefore, description is directed to the suction nozzles 10, . . . , 10 of the working head 4 of the XY robot 5 as a representative example.

Figure 2A:
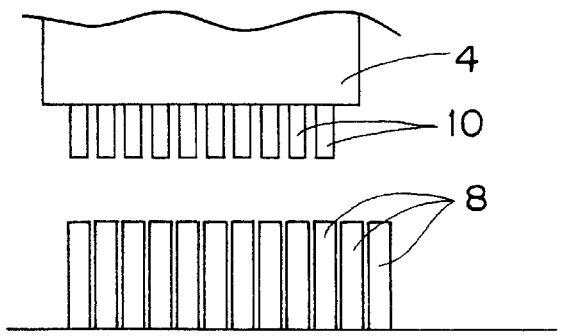
FIGS. 2A, 2B, 2C, and 2D are explanatory views of a state in which positional displacements of components at component supply positions of component supply cassettes in the component mounting apparatus are corrected, thereby enabling a plurality of nozzles to suck components at one time.

In FIG. 2A, each of the ten suction nozzles 10, . . . , 10 is moved by the working head 4 based on driving of the XY robot 5, under control of the control part 1000, to a suction preparation position above a component supply position 89 of each of ten component supply cassettes 80.

Figure 2B:
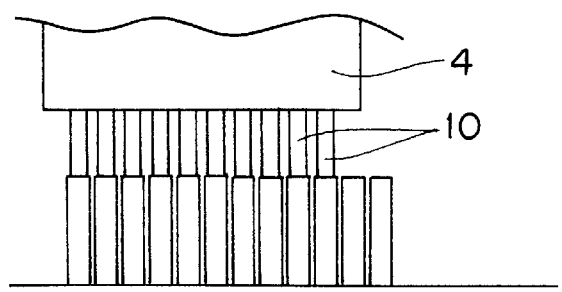

Next, as shown in FIG. 2B, the ten suction nozzles 10 move down towards the corresponding component supply positions 89 from the suction preparation positions concurrently. After simultaneously sucking and holding ten components 103, . . . , 103 arranged at the ten component supply positions 89, the suction nozzles move up to the suction preparation positions again.

Figure 2C:
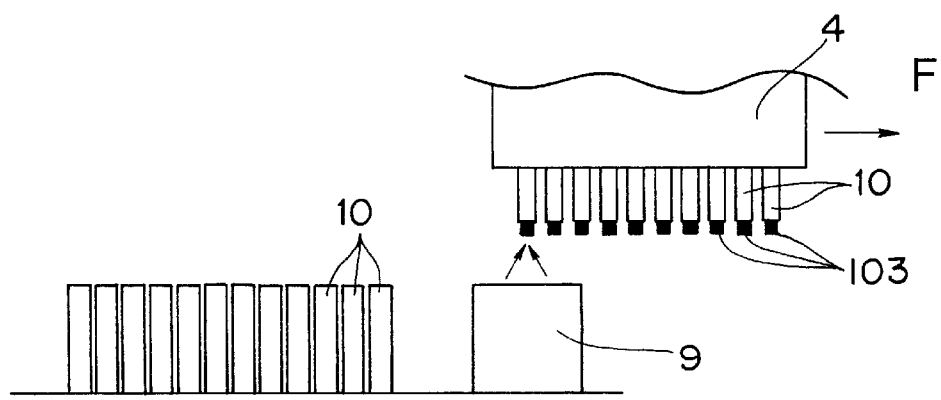

Then, as shown in FIG. 2C, the suction nozzles move towards the recognition camera 9, from the suction preparation positions, as a result of driving of the XY robot 5. While the ten suction nozzles are moving over the recognition camera 9, the recognition camera 9 recognizes positions, postures, shapes, or the like of the ten components 103, . . . , 103.

Figure 2D:
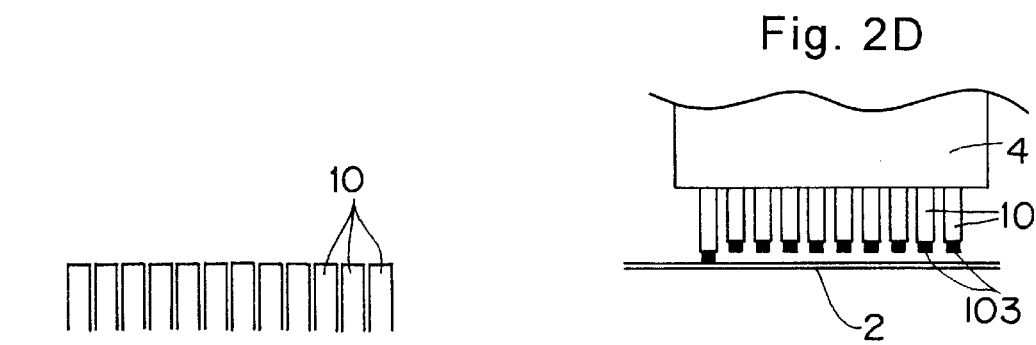

Next, as shown in FIG. 2D, upon completion of such recognition, the head 4 is controlled to be driven in XY directions, or each nozzle 10 is controlled to rotate by θ upon necessities, to correct a posture or position of each of the ten components 103, . . . , 103 under control of the control part 1000 based on a recognition result obtained by the recognition camera 9. The components are then placed respectively at predetermined placing positions of board 2.

Since a rotation amount of each pulse motor 880 of the component supply cassettes 80 is adjusted to correct initial positional displacement on the basis of initial correction information in this manner, positional displacement in a Y direction of each nozzle 10 is absorbed, thereby enabling components to be more surely sucked and held.

However, in the case of placing minute components such as minute IC chips or the like, onto a body to be mounted, such as the board or the like, because of positional displacement or an error in feed amount, as a result of a mounting error of carrier tape 101 accommodating components 103, relative to the component supply cassette 80, a biased position of each component 103 in a component storage recess 102, or the like, sometimes becomes an impediment to correct transfer of the component 103 to a component supply position 89 of a component supply cassette 80. Nozzle 10 cannot suck and hold a component in such a case. For solving this problem, correction information for a side of the component supply cassette is obtained as will be discussed below, and on the basis of this component supply cassette-side correction information, in addition to the earlier-described initial correction information, a component 103 at component supply position 89 of a component supply cassette 80 is positionally adjusted, whereby each nozzle 10 can stably and properly suck and hold a component, with a suction rate at each nozzle 10 being improved.

Specifically, when each component 103 is sucked and held by each nozzle 10 as shown in FIGS. 2A and 2B, and then recognized as to posture and the like by the recognition camera 9 as in FIG. 2C, a positional displacement amount in a Y direction of each component 103 obtained by the control part 1000 from such recognition result is compared with an initial positional displacement amount of each nozzle, thereby obtaining positional displacement amount $\Delta y$ in the Y direction generated when the component is sucked in this time. The obtained positional displacement amount $\Delta y$ in the Y direction is stored as correction information for a component supply cassette in the memory 910. The correction information for the component supply cassette is sent to a corresponding component supply cassette .80, where a rotation amount of pulse motor 880 is adjusted on the basis of both the sent correction information for the component supply cassette and initial correction information based on initial positional displacement of nozzle 10 that is next to suck a component. As a result, a movement amount for moving each component 103 to a component supply position 89 along the Y direction is adjusted, and a position of component 103 at the component supply position 89 is adjusted. According to this arrangement, each component 103 is positioned to a position conforming to initial positional displacement of each nozzle 10 which is to subsequently suck a component, and to positional displacement of the component supply cassette, so that an initial positional displacement amount of nozzle 10 and a positional displacement amount of the component supply cassette are absorbed. Each of the nozzles 10 is enabled to more surely suck and hold a component 103 at component supply position 89 as shown in FIGS. 2A and 2B.

By way of example, when a first nozzle 10 at an end part of the ten nozzles 10 includes an initial positional displacement amount $\Delta y$ in a Y direction of 0.5 mm, a rotation amount of pulse motor 880 at an eleventh component supply cassette 80 estimated to be sucked by the first nozzle 10 is adjusted, thereby shifting component 103 by 0.5 mm from a predetermined reference position at a component supply position 89. Consequently, the first nozzle 10 displaced by the initial positional displacement amount $\Delta y$ of 0.5 mm in the Y direction can surely suck and hold the component 103 shifted by 0.5 mm at the component supply position 89. Moreover, if the component 103 after being sucked is recognized to include a positional displacement amount of 1.2 mm, i.e. 0.7 mm as a difference therebetween is judged to be a positional displacement amount at a side of the eleventh component supply cassette generated when the component is sucked, a rotation amount of the pulse motor 880 for the eleventh component supply cassette 80 is adjusted to further shift the component 103 at the component supply position 89 by 0.7 mm. Sucking and holding smaller components is effectuated in this manner. In a case where a nozzle 10, which is to next suck and hold at the eleventh component supply cassette 80, is a fifth nozzle 10, and the fifth nozzle 10 includes an initial positional displacement amount of 0.3 mm in the Y direction, the eleventh component supply cassette 80 is adjusted to shift the component 103 at the component supply position 89 by a sum of 1.0 mm, i.e. the positional displacement amount 0.7 mm specific to the eleventh component supply cassette 80 and the positional displacement amount 0.3 mm specific to the fifth nozzle 10.

In the above-described embodiment, the control part 1000 judges whether or not a positional displacement amount at a side of component supply cassette 80 is in a range correctable by adjustment of pulse motor 880. If the positional displacement amount is in the range correctable by such adjustment, drive of the pulse motor 880 is controlled, thereby adjusting a position of a component 103 at component supply position 89 and absorbing positional displacement of the component supply cassette 80. On the other hand, if the positional displacement amount is out of the correctable range, drive of the pulse motor 880 is not controlled and simultaneous suction can be switched to a sequential suction operation without performing the simultaneous suction.

More specifically, as shown in FIGS. 3A–3C and 4, only components in a simultaneous suctionable range, where components can be sucked simultaneously, are set as one group and sucked and held simultaneously by nozzles 10 corresponding to the group, from among, e.g., ten nozzles 10, . . . , 10. Thereafter, head 4 can be moved in a Y direction to suck component(s) by nozzle(s) 10 that could not suck component(s) in the previous suction operation.

FIGS. 3A–3D are diagrams of a case in which first and second supply cassettes 80A, 80A from a left end among component supply cassettes 80 set in a simultaneous suctionable range can position respective components 103, 103 to proper supply positions, third through fifth supply cassettes 80B, . . . , 80B can position components 103 to supply position allowable limits and, the remaining five, namely, sixth through tenth component supply cassettes 80C, . . . , 80C can position components 103, . . . , 103 to suction impossible positions. A suction operation to be described below is carried out for these first through tenth component supply cassettes.

Figure 3A:
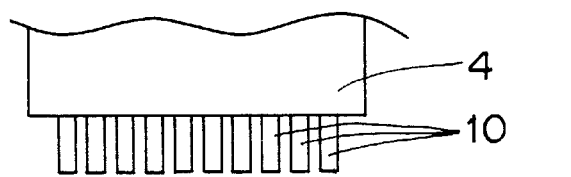
FIGS. 3A, 3B, 3C, and 3D are explanatory views of a state in which a nozzle positional displacement amount in the component mounting apparatus is corrected, thereby enabling a plurality of nozzles to suck at successive times.

As indicated in FIG. 3A, under control of the control part 1000, the ten suction nozzles 10, . . . , 10 are moved by the working head 4 based on driving of the XY robot 5 to suction preparation positions above respective component supply positions 89 of the first through tenth component supply cassettes 80A, . . . 80C.

Figure 3B:
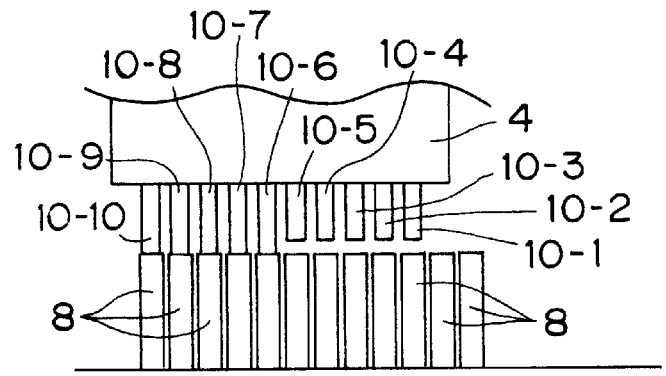

Next, as shown in FIG. 3B, the first and second component supply cassettes 80A, 80A, and the third through fifth component supply cassettes 80B, . . . , 80B, in a simultaneous suctionable range are set in one group. First through fifth nozzles 10, . . . , 10 execute simultaneous suction at the first through fifth component supply cassettes, respectively. That is, the first through fifth nozzles 10, . . . , 10 simultaneously move down to corresponding component supply positions 89 from the suction preparation positions, simultaneously suck and hold a batch of five components 103, . . . , 103 present at the corresponding component supply positions 89, . . . , 89, and thereafter move up to the suction preparation positions.

Figure 3C:
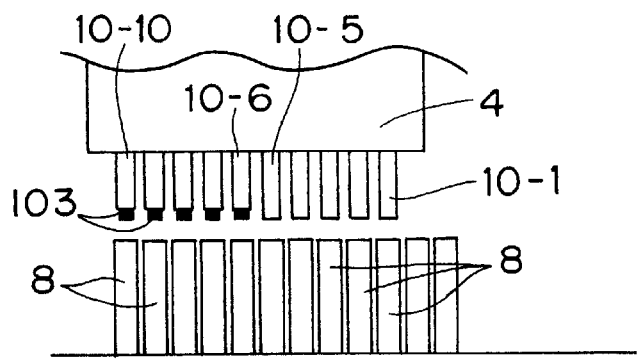

Then, as shown in FIG. 3C, the head 4 moves along the Y direction to move the nozzles 10, . . . , 10 to a position where the nozzles can simultaneously suck a group of sixth through tenth components corresponding to the sixth through tenth component supply cassettes 80C, . . . , 80C. At this time, the first through fifth nozzles 10, . . . , 10 still suck and hold components 103, . . . , 103.

Figure 3D:
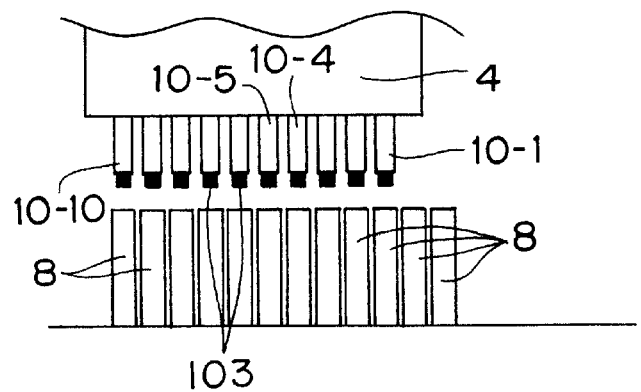

Next, as shown in FIG. 3D, sixth through tenth nozzles 10, . . . , 10 simultaneously suck a group of the sixth through tenth components at the corresponding component supply cassettes 80C, . . . , 80C. That is, the sixth through tenth nozzles 10 simultaneously move down to corresponding component supply positions 89 from suction preparation positions, simultaneously suck and hold five components 103, . . . , 103 placed at the corresponding component supply positions 89, . . . , 89, and then move up back to the suction preparation positions.

Recognition and placement are executed afterwards as shown in FIGS. 2C and 2D.

Positional displacement in an X direction is also corrected as will be described below according to the embodiment.

Figure 7:
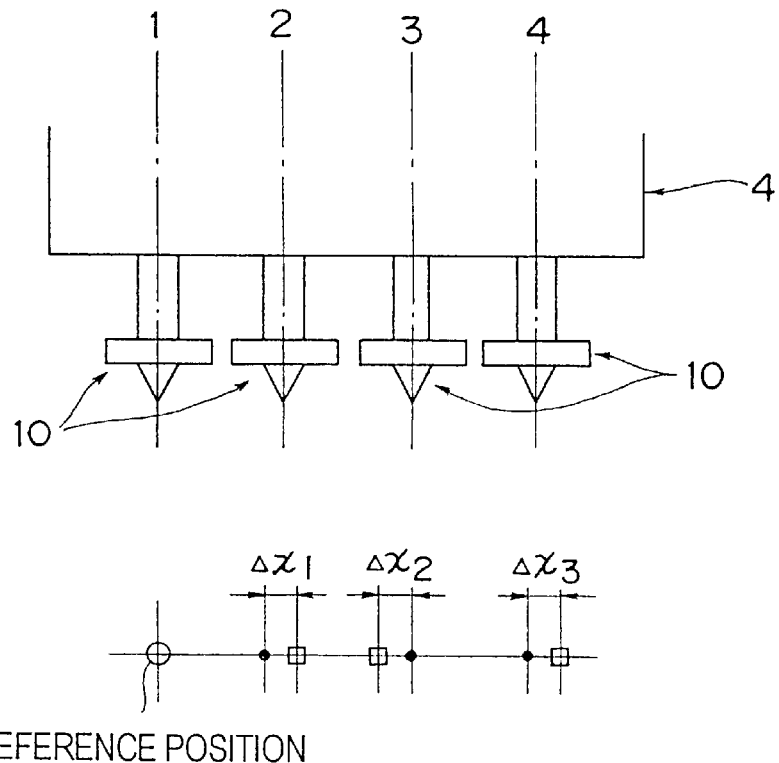
FIG. 7 is an explanatory view of a positional displacement in an X direction of a plurality of nozzles in the prior art.

Referring to FIG. 7, positional displacement is generally generated in an X direction of a nozzle 10 between a normal reference position and an actual position because of machining accuracy. Conventionally, such positional displacement has been corrected by registering a first nozzle 10 (nozzle designated by number 1 in FIG. 7) to a reference position, thereafter mechanically adjusting positional displacement amounts $\Delta x_1 - \Delta x_3$ between normal reference positions (indicated by black circles in FIG. 7) and actual positions (indicated by square marks in FIG. 7) of other nozzles (for example, second to fourth nozzles 10 designated by numbers 2, 3, 4 in FIG. 7), thereby registering the other nozzles relative to the normal reference positions to enable simultaneous suction. However, it was difficult to mechanically adjust ten nozzles 10, . . . , 10.

Figure 9:
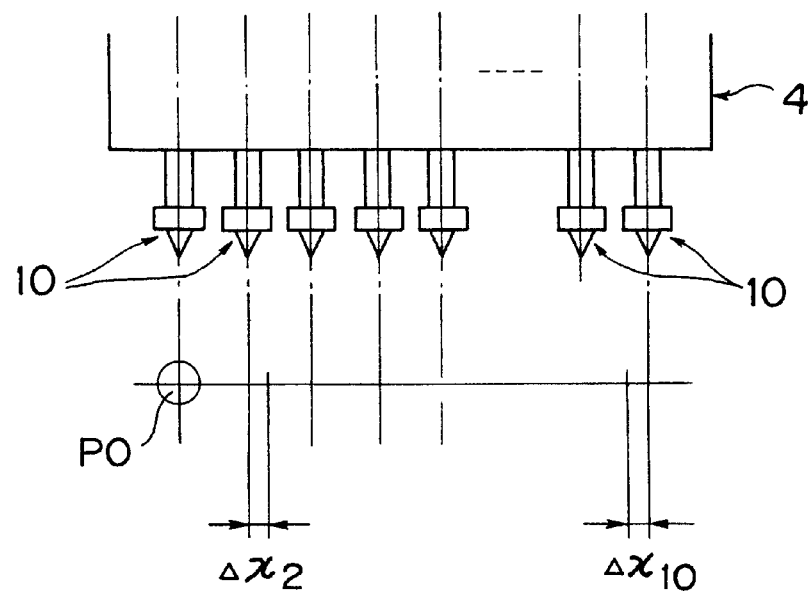
FIG. 9 is an explanatory view of positional displacement in an X direction of a plurality of nozzles of the mounting apparatus.

In contrast, according to an embodiment as shown in FIG. 9, a first nozzle 10 (left end nozzle in FIG. 9) is registered relative to a reference position at a calibration time described earlier, then positional displacement amounts $\Delta x$, specifically, $\Delta x_2 - \Delta x_{10}$ in an X direction between normal reference positions (indicated by black circles in FIG. 9) and actual positions of the second through tenth nozzles 10, . . . , 10 are obtained by the control part 1000. The control part 1000 obtains an average value of the positional displacement amounts $\Delta x_2 - \Delta x_{10}$, adjusts a driving control of working head 4 to shift a reference position of the working head 4, i.e., reference positions of the first through tenth nozzles 10, . . . , 10, by the average value. Since the positional displacement amounts in the X direction are averaged, a degree of effects of the positional displacements is decreased and labor for mechanical adjustment is saved. The nozzles can more surely and more stably suck components with an individual nozzle suction rate improved.

In this embodiment, a positional displacement of a nozzle 10 along a Y direction relative to a reference position is detected and, the control part 1000 controls driving of pulse motor 880 for moving components one by one along the Y direction to component supply position 89 at component supply cassette 80, where a component is to be held by the nozzle 10 based on an amount of the positional displacement of the nozzle 10 along the Y direction relative to the reference position, which amount is determined on the basis of a detection result when positional displacement is detected, with the amount of the positional displacement being taken into account, whereby a movement amount for moving components 103 one by one along the Y direction to the component supply position 89 is adjusted and a component 103 at the component supply position 89 can be adjusted positionally. Therefore, the nozzle 10 displaced by the positional displacement amount, can hold the component 103 supplied to the component supply position 89 with the movement amount being adjusted at the component supply cassette 80. Components can thus be stably and properly sucked and held by component supply cassettes 80, and a suction rate at the component supply cassettes 80 can be improved.

Figure 8:
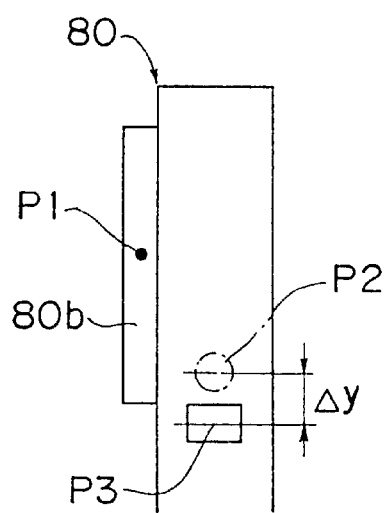
FIG. 8 is an explanatory view for position adjustment relative to a positional displacement in a Y direction at a component supply cassette in the prior art.
Figure 10:
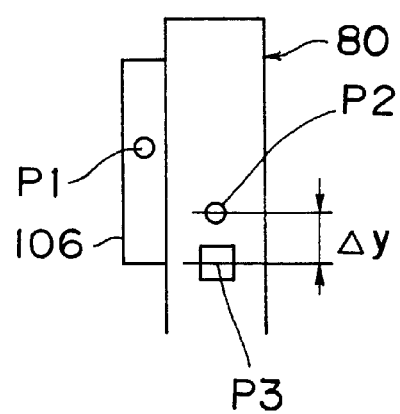
FIG. 10 is an explanatory view for adjustment relative to positional displacement in a Y direction at a component supply cassette of the mounting apparatus.
Figure 11:
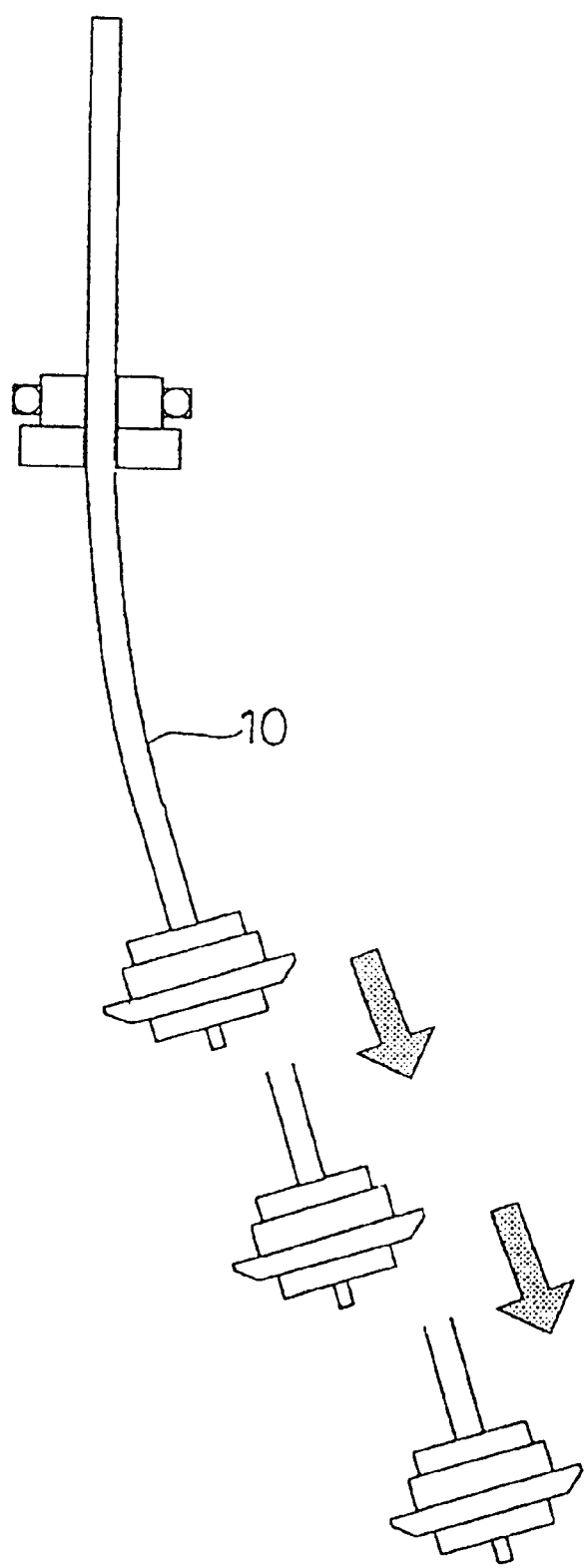
FIG. 11 is an explanatory view of positional displacement caused by shaft deflection.

According to the second and seventh aspects of the present invention, positional displacement along a Y direction of each of a plurality of nozzles 10, . . . , 10 relative to a reference position is detected. Each component supply cassette 80, where a component is to be held by each nozzle 10, is controlled based on an amount of positional displacement of nozzle 10 along the Y direction relative to a reference position, which amount is determined on the basis of a detection result when the above positional displacement is detected, through driving control of pulse motor 880 which moves components 103 one by one along the Y direction to component supply position 89 with the positional displacement amount being taken into account, whereby a movement amount for moving the components 103 one by one along the Y direction to the component supply position 89 is adjusted, and therefore a position of each component 103 at the component supply position 89 is adjusted. Even when the nozzles 10, . . . , 10 are to suck components 103, . . . , 103 simultaneously, each of the nozzles 10, displaced by the positional displacement amount, can hold a component 103 supplied to component supply position 89 with a movement amount being adjusted at component supply cassette 80. Each component supply cassette 80 effectuates stable and proper suction and holding, thus having its individual suction rate improved. As shown in FIG. 8, although positional displacement in a Y direction could be conventionally corrected by mechanically adjusting an installing center position P1 of a sprocket 80b which sends carrier tape 101, thereby adjusting a center position P2 of a corresponding nozzle and a center position P3 of a component 103, it was complicated and practically difficult to mechanically adjust installation positions of sprockets 80b of many component supply cassettes. At the same time, positional displacement in a Y direction probably differs for each nozzle of a plurality of nozzles used for mounting, which cannot be handled by the above mechanical adjustment. In other words, only positional displacement in Y directions inherent in component supply cassettes could be adjusted by mechanical adjustment. In the present embodiment as shown in FIG. 10, drive of pulse motor 880 is controlled in place of mechanically adjusting an installing center position P1 of sprocket 106, whereby a center position P3 of component 103 can be shifted towards a center position P2 of a corresponding nozzle, thus enabling simpler and surer positional adjustment. Furthermore, component positional adjustment can be previously executed to respond to positional displacement of the nozzle; that is, not only to positional displacement in Y directions specific to component supply cassettes, but also to positional displacement in Y directions possibly different for each nozzle of a plurality of nozzles, used for mounting, before each nozzle carries out a suction operation at a component supply cassette 80. Both the positional displacement specific to the nozzles and the positional displacement in the Y direction specific to the component supply cassettes are properly handled, and consequently each nozzle can stably and properly suck a component and a suction rate at an individual component supply cassette can be improved.

According to the third and eighth aspects of the present invention, in detecting positional displacement as above, positional displacement of nozzles 10, . . . , 10 along X directions relative to respective reference positions can be detected. An average value of positional displacement amounts in the X directions relative to the respective reference positions of the nozzles 10, . . . , 10, which are determined based on a detection result of a positional displacement detection, is obtained. Based on this average value, reference positions of the heads 4, 14, in other words, suction preparation positions of the heads 4, 14 when executing component suction operation of component supply cassettes 80, . . . , 80 by the nozzles 10, . . . , 10, are adjusted (with reference to FIGS. 2A and 3A). Thereafter, the nozzles 10, . . . , 10 can accordingly hold components

103, ..., 103 supplied to component supply positions 89, ..., 89 from component supply cassettes 80, ..., 80. Concretely, after a first nozzle 10 (left end nozzle in FIG. 9) is registered relative to a reference position, positional displacement amounts $\Delta x_2 - \Delta x_{10}$ in an X direction between normal reference positions (illustrated by black circles in FIG. 9) and actual positions of the second through tenth nozzles 10, ..., 10 are obtained by the control part 1000. The control part 1000 in turn obtains an average value of the positional displacement amounts $\Delta x_2 - \Delta x_{10}$, adjusts a driving control of the working head 4 to shift a reference position of the working head 4, namely, reference positions of the first through tenth nozzles 10, ..., 10 by the average value. Since the positional displacement amounts in the X direction are averaged, a degree of effects of positional displacement is reduced, labor for mechanical adjustment is eliminated, surer and more stable suction is carried out, and a suction rate at an individual nozzle is improved.

With this arrangement, each of the nozzles 10 can hold a component 103 supplied to a component supply position 89 from a component supply cassette 80 while positional displacement not only in a Y direction, but also in an X direction is taken into consideration. Suction and holding by component supply cassettes 80 can thereby be more stably and properly conducted, and a suction rate at each component supply cassette 80 can be improved.

According to the fourth and ninth aspects of the present invention, it is judged whether a positional displacement amount is in a range correctable through a driving control of pulse motor 880. If the positional displacement amount is in a range correctable by such control, a drive of the pulse motor 880 is controlled to adjust a movement amount for moving components 103, ..., 103 one by one along a Y direction to a component supply position 89. On the other hand, when the positional displacement amount is outside a correctable range, the pulse motor 880 is not controlled, but a nozzle 10 may be moved by the positional displacement amount along a Y direction to perform a component holding operation.

With this arrangement, an optimum operation can thus be selected by performing proper judgment in accordance with whether or not a positional displacement amount is in a range correctable by a driving control of pulse motor 880. A mounting tact can thus be reduced further.

According to the fifth and tenth aspects of the present invention, it is judged whether or not a positional displacement amount of each nozzle is in a range correctable through a driving control of a corresponding pulse motor 880. When all positional displacement amounts are in such a range, a movement amount for moving components 103, ..., 103 one by one to component supply positions 89 along a Y direction is adjusted through driving control of each pulse motor 880. On the other hand, if any of the positional displacement amounts is outside the range, one or a plurality of nozzles 10, ..., 10, other than the nozzles with the positional displacement amount outside the range, are allowed to hold components, and then the heads 4, 14 may be moved in the Y direction by an amount corresponding to the positional displacement amount outside the range so as to make the nozzle(s) with the positional displacement amount outside the range hold component(s).

In such a manner, even when components 103, ..., 103 are to be simultaneously sucked by nozzles 10, ..., 10, depending on whether or not a positional displacement amount of each nozzle can be corrected by driving control of pulse motor 880, an adequate judgment is made and an optimum operation can be selected to perform simultaneous suction operation in a range within which suction at one time is possible. A mounting tact (mounting process time) can be additionally reduced accordingly.

The present invention is not limited to the foregoing embodiments and can be carried out in various other modes.

For example, the present invention is not restricted to an apparatus and method of the above-described constitution, and is applicable to component mounting apparatuses of any structure wherein suction nozzles, as an example of component holding members, hold components supplied from component supply cassettes 80 which hold and supply the components respectively, and then the suction nozzles place the held components onto a board as an example of a body to be mounted, although not specifically shown.

As a component supplying member, a form is not limited to a component supply cassette and the present invention is applicable similarly to a tray type, or the like, so long as components from a component supply section of the tray type or the like are rearranged at a belt conveyor-shaped transfer member and supplied to a component supply position, where the components can be sucked by nozzle(s), by driving the transfer member while a transfer amount of the transfer member is adjusted and changed with positional displacement amount(s) of the nozzle(s) taken into consideration.

According to the first and sixth aspects of the present invention, positional displacement along a second direction of a component holding member or of a component held by the component holding member, relative to a reference position of the component holding member is detected. While an amount of the positional displacement along the second direction of the component holding member, or the component held by the component holding member, relative to the reference position of the component holding member, which is determined on the basis of a detection result at a time of detecting the positional displacement, is taken into account, a movement amount for moving components one by one along the second direction to a component supply position is adjusted at a component supplying member where a component is to be held by the component holding member based on the positional displacement amount. The movement amount is adjusted by controlling a drive of a component supply driving device which moves the components one by one along the second direction to the component supply position, whereby a position of a component at the component supply position can be adjusted. The component supplied to the component supply position with the movement amount adjusted at the component supplying member can be held by the component holding member, taking into account the positional displacement amount. A component can thus be stably and properly sucked and held by the component supplying member, with a suction rate at the component supplying member being improved.

According to the second and seventh aspects of the present invention, positional displacements along a second direction of the component holding members, or of components held by the component holding members, relative to respective reference positions of the component holding members, are detected. While an amount of each of the positional displacements along the second direction of the component holding members, or of the components held by the component holding members, relative to the reference positions of the component holding members, which is determined on the basis of a detection result at a time of detecting a positional displacement, is taken into account, a movement amount for moving components one by one along the second direction to component supply positions is adjusted by controlling a drive of a component supply driving device which moves the components one by one along the second direction to the component supply positions based on each of positional displacement amounts at each of the component supplying members where the components are to be held by the component holding members on the basis of each positional displacement amount, whereby a position of each component at each component supply position can be adjusted. Even when components are to be sucked simultaneously by a plurality of component holding members, each component supplied to the component supply position with a movement amount adjusted at each component supplying member can be held by each component holding member, taking into account the positional displacement amount. Each component supplying member can thus stably and properly suck and hold a component and, a suction rate at individual component supplying members can be improved.

According to the third and eighth aspects of the present invention, a positional displacement along a first direction of each of component holding members, or of components held by the component holding members, relative to respective reference positions of the component holding members is detected and, an average value of amounts of the positional displacements along the first direction of the component holding members, or of components held by the component holding members, relative to the respective reference positions of the component holding members, which are determined on the basis of a detection result at a time of detecting positional displacement, is obtained. This arrangement enables the component holding members to hold components supplied to component supply positions from component supplying members after a reference position of the head is adjusted on the basis of the obtained average value.

As above, positional displacement not only in the second direction, but also in the first direction, is taken into account when components supplied to component supply positions from component supplying members are held by component holding members, and consequently, each component supplying member can more stably and properly suck and hold a component with a suction rate improved.

According to the fourth and ninth aspects of the present invention, whether or not a positional displacement amount is in a range correctable by a driving control of the component supply driving device is judged. A movement amount for moving components one by one along a second direction is adjusted by the driving control of the component supply driving device when the positional displacement amount is in such a range. On the other hand, when the positional displacement amount is outside the range, a component holding member, before holding a component, is moved by the positional displacement amount along the second direction without executing driving control of the component supply driving device.

With the above arrangement, an optimum operation can be selected through an optimum judgment of whether or not positional displacement is within a range correctable by a driving control of a component supply driving device, and therefore mounting tact is further reduced.

According to the fifth and tenth aspects of the present invention, whether or not an amount of each positional displacement is in a range correctable by a driving control of each component supply driving device is judged and, each movement amount for moving components one by one along a second direction to each component supply position is adjusted by the driving control of each component supply driving device when all positional displacement amounts are within such a range. To the contrary, if any of the positional displacement amounts is out of the range, an arrangement may be devised so that component holding member(s) other than the component holding member(s) having positional displacement amount(s) outside the range are allowed to hold component(s), a head is moved along the second direction by an amount corresponding to a positional displacement amount outside the range, and a component holding member, displaced by the positional displacement amount outside the range, is allowed to hold a component.

Accordingly, even when a components are to be sucked simultaneously by component holding members, an optimum operation can be selected to execute simultaneous suction in a range where suction is possible at one time based on an adequate judgment of whether each of positional displacement amounts is in a range correctable by a driving control of a component supply driving device. Thus, a mounting tact is decreased further.

It is to be noted that, by appropriately combining arbitrary embodiments of the aforementioned various embodiments, effects owned by these embodiments can be produced.

Although the present invention has been fully described in connection with preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:
   a component holding member set to a head that is movable in mutually orthogonal first and second directions;
   a component supplying member having a component supply driving device which is operable to move components one by one along the second direction to a component supply position;
   a positional displacement detecting device for detecting positional displacement of said component holding member or a component held by said component holding member along the second direction relative to a reference position of said component holding member; and
   a controller for enabling a component at the component supply position to be held by said component holding member, by
   (i) in response to a positional displacement amount of said component holding member or the component held by said component holding member along the second direction relative to the reference position of said component holding member based on positional displacement of said component holding member or the component held by said component holding member as detected by said positional displacement detecting device, controlling said component supply driving device so as to adjust an amount by which the components are moved one by one along the second direction to the component supply position, and
   (ii) prior to said component holding member holding a component at the component supply position, and in response to a positional displacement amount of said component holding member or the component held by said component holding member along the second direction relative to the reference position of said component holding member based on positional displacement of said component holding member or the component held by said component holding member as detected by said positional displacement detecting device, judging whether or not the positional displacement amount of said component holding member along the second direction is within a range that is correctable by control of said component supply driving device, and (a) when the positional displacement amount of said component holding member along the second direction is within the range, controlling said component supply driving device so as to adjust an amount by which the components are moved one by one along the second direction to the component supply position, and (b) when the positional displacement amount of said component holding member along the second direction is outside the range, moving said component holding member the positional displacement amount along the second direction without controlling said component supply driving device so as to not adjust an amount by which the components are moved one by one along the second direction to the component supply position.

2. A component mounting apparatus comprising:

component holding members set to a head that is movable in mutually orthogonal first and second directions;

component supplying members having component supply driving devices, respectively, which are operable to move components one by one along the second direction to corresponding component supply positions;

a positional displacement detecting device for
  (i) detecting positional displacement of each of said component holding members or a component held by a respective said each of said component holding members along the second direction relative to a reference position of said respective said each of said component holding members, and
  (ii) detecting positional displacement of each of said component holding members or the component held by said respective said each of said component holding members along the first direction relative to the reference position of said respective said each of said component holding members; and a controller for enabling components at the corresponding component supply positions to be held by said component holding members, respectively, by
  (i) in response to a positional displacement amount of each of said component holding members or the component held by said respective said each of said component holding members along the second direction relative to the reference position of said respective said each of said component holding members based on positional displacement of said each of said component holding members or the component held by said respective said each of said component holding members along the second direction as detected by said positional displacement detecting device, controlling said component supply driving devices so as to adjust an amount by which respective components are moved one by one along the second direction to the corresponding component supply positions, and
  (ii) prior to said component holding members holding respective components at the corresponding component supply positions, and in response to an average value of positional displacement amounts of said component holding members or respective components held by said component holding members along the first direction relative to respective reference positions of said component holding members based on positional displacement of said each of said component holding members or said component held by said respective said each of said component holding members along the first direction as detected by said positional displacement detecting device, adjusting a reference position of said head.

3. The component mounting apparatus according to claim 2, wherein said controller is for enabling components at the corresponding component supply positions to be held by said component holding members, respectively, by also
  (i) in response to a positional displacement amount of each of said component holding members or the component held by said respective said each of said component holding members along the second direction relative to the reference position of said respective said each of said component holding members based on positional displacement of said each of said component holding members or the component held by said respective said each of said component holding members along the second direction as detected by said positional displacement detecting device, judging whether or not the positional displacement amount of each of said component holding members or the component held by said respective said each of said component holding members is within a range that is correctable by control of said component supply driving devices, respectively, and
  (a) when the positional displacement amount of each of said component holding members or the component held by said respective said each of said component holding members is within the range, controlling said component supply driving devices so as to adjust an amount by which respective components are moved one by one along the second direction to the corresponding component supply positions, and
  (b) when the positional displacement amount of any of said component holding members or the component held by said respective said each of said component holding members is outside the range,
    (1) allowing each of said component holding members other than said any of said component holding members to hold respective components,
    (2) moving said any of said component holding members the positional displacement amount along the second direction, and then
    (3) allowing said any of said component holding members to hold respective components.

4. A component mounting apparatus comprising:

component holding members set to a head that is movable in mutually orthogonal first and second directions;

component supplying members having component supply driving devices, respectively, which are operable to move components one by one along the second direction to corresponding component supply positions;

a positional displacement detecting device for detecting positional displacement of each of said component holding members or a component held by a respective said each of said component holding members along the second direction relative to a reference position of said respective said each of said component holding members; and a controller for enabling components at the corresponding component supply positions to be held by said component holding members, respectively, by (i) in response to a positional displacement amount of each of said component holding members or the component held by said respective said each of said component holding members along the second direction relative to the reference position of said respective said each of said component holding members based on positional displacement of said each of said component holding members or the component held by said respective said each of said component holding members along the second direction as detected by said positional displacement detecting device, controlling said component supply driving devices so as to adjust an amount by which respective components are moved one by one along the second direction to the corresponding component supply positions, and (ii) in response to a positional displacement amount of each of said component holding members or the component held by said respective said each of said component holding members along the second direction relative to the reference position of said respective said each of said component holding members based on positional displacement of said each of said component holding members or the component held by said respective said each of said component holding members along the second direction as detected by said positional displacement detecting device, judging whether or not the positional displacement amount of each of said component holding members or the component held by said respective said each of said component holding members is within a range that is correctable by control of said component supply driving devices, respectively, and (a) when the positional displacement amount of each of said component holding members or the component held by said respective said each of said component holding members is within the range, controlling said component supply driving devices so as to adjust an amount by which respective components are moved one by one along the second direction to the corresponding component supply positions, and (b) when the positional displacement amount of any of said component holding members or the component held by said respective said each of said component holding members is outside the range, (1) allowing each of said component holding members, other than said any of said component holding members, to hold components at respective corresponding component supply positions, (2) moving said any of said component holding members the positional displacement amount along the second direction, and then (3) allowing said any of said component holding members to hold components at respective corresponding component supply positions.

5. A method of mounting components by using an apparatus that includes (i) component holding members set to a head that is movable in mutually orthogonal first and second directions, and (ii) component supplying members having component supply driving devices, respectively, said method comprising:

detecting positional displacement of each of said component holding members or a component held by a respective said each of said component holding members along the second direction relative to a reference position of said respective said each of said component holding members;

detecting positional displacement of each of said component holding members or said component held by said respective said each of said component holding members along the first direction relative to said reference position of said respective said each of said component holding members;

obtaining an average value of positional displacement amounts of said component holding members or respective components held by said component holding members along said first direction relative to respective reference positions of said component holding members based on positional displacement of each of said component holding members or said component held by said respective said each of said component holding members as detected along said first direction;

in response to said average value, adjusting a reference position of said head;

in response to a positional displacement amount of said each of said component holding members or said component held by said respective said each of said component holding members along said second direction relative to said reference position of said respective said each of said component holding members based on positional displacement of each of said component holding members or said component held by said respective said each of said component holding members as detected along said second direction, controlling said component supply driving devices so as to adjust an amount by which respective components are moved one by one along said second direction to corresponding component supply positions; and at said corresponding component supply positions, holding said respective components with said component holding members, respectively.

6. A method of mounting components by using an apparatus that includes (i) a component holding member set to a head that is movable in mutually orthogonal first and second directions, and (ii) a component supplying member having a component supply driving device, said method comprising:

detecting positional displacement of said component holding member or a component held by said component holding member along the second direction relative to a reference position of said component holding member;

in response to a positional displacement amount of said component holding member or said component held by said component holding member along said second direction relative to said reference position of said component holding member based on positional displacement of said component holding member or said component held by said component holding member as detected along said second direction, judging whether or not said positional displacement amount of said component holding member or said component held by said component holding member is within a range that is correctable by control of said component supply driving device, and (i) when said positional displacement amount of said component holding member or said component held by said component holder is within said range, controlling said component supply driving device so as to adjust an amount by which components are moved one by one along said second direction to a component supply position, and (ii) when said positional displacement amount of said component holding member or said component held by said component holder is outside said range, moving said component holding member said positional displacement amount along said second direction without controlling said component supply driving device so as to not adjust an amount by which components are moved one by one along said second direction to a component supply position; and at said component supply position, holding one of said components with said component holding member.

7. A method of mounting components by using an apparatus that includes (i) component holding members set to a head that is movable in mutually orthogonal first and second directions, and (ii) component supplying members having component supply driving devices, respectively, said method comprising:

detecting positional displacement of each of said component holding members or a component held by a respective said each of said component holding members along the second direction relative to a reference position of said respective said each of said component holding members;

in response to a positional displacement amount of said each of said component holding members or said component held by said respective said each of said component holding members along the second direction relative to said reference position of said respective said each of said component holding members based on positional displacement of each of said component holding members or said component held by said respective said each of said component holding members as detected along said second direction, judging whether or not said positional displacement amount of each of said component holding members or said component held by said respective said each of said component holding members is within a range that is correctable by control of said component supply driving devices, respectively, and (i) when said positional displacement amount of each of said component holding members or said component held by said respective said each of said component holding members is within said range, (a) controlling said component supply driving devices so as to adjust an amount by which respective components are moved one by one along said second direction to corresponding component supply positions, and then (b) at said corresponding component supply positions, allowing said component holding members to hold components, respectively, and (ii) when said positional displacement amount of any of said component holding members or said component held by said respective said each of said component holding members is outside said range, (a) allowing each of said component holding members, other than said any of said component holding members, to hold a component at a respective corresponding component supply position, (b) moving said any of said component holding members said positional displacement amount along said second direction, and then (c) at corresponding component supply positions, allowing said any of said component holding members to hold components, respectively.

8. A method of mounting components by using an apparatus that includes (i) component holding members set to a head that is movable in mutually orthogonal first and second directions, and (ii) component supplying members having component supply driving devices, respectively, said method comprising:

detecting positional displacement of each of said component holding members or a component held by a respective said each of said component holding members along the second direction relative to a reference position of said respective said each of said component holding members;

detecting positional displacement of each of said component holding members or said component held by said respective said each of said component holding members along the first direction relative to said reference position of said respective said each of said component holding members;

obtaining an average value of positional displacement amounts of said component holding members or respective components held by said component holding members along said first direction relative to respective reference positions of said component holding members based on positional displacement of each of said component holding members or said component held by said respective said each of said component holding members as detected along said first direction;

in response to said average value, adjusting a reference position of said head;

judging whether or not said positional displacement amount of said each of said component holding members or said respective component held by said each of said component holding members along said second direction is within a range that is correctable by control of said respective said component supply driving devices, and (i) when said positional displacement amount of each of said component holding members or said component held by said respective said each of said component holding members along said second direction is within said range, (a) controlling said component supply driving devices so as to adjust an amount by which respective components are moved one by one along said second direction to corresponding component supply positions, and then (b) at said corresponding component supply positions, allowing said component holding members to hold components, respectively, and (ii) when said positional displacement amount of any of said component holding members or said component held by said respective said each of said component holding members along said second direction is outside said range, (a) allowing each of said component holding members, other than said any of said component holding members, to hold a component at a respective corresponding component supply position, (b) moving said any of said component holding members said positional displacement amount along said second direction, and then (c) at corresponding component supply positions, allowing said any of said component holding members to hold components, respectively.

* * * * *